US006351508B1

(12) United States Patent
Shishkoff et al.

(10) Patent No.: US 6,351,508 B1
(45) Date of Patent: Feb. 26, 2002

(54) PHASE/FREQUENCY DETECTOR FOR DEJITTER APPLICATIONS

(75) Inventors: Alexis Shishkoff, Raleigh; Barry L. Stakely, Snowcamp, both of NC (US)

(73) Assignee: TranSwitch Corporation, Shelton, CT (US)

( * ) Notice: Subject to any disclaimer, the term of this patent is extended or adjusted under 35 U.S.C. 154(b) by 0 days.

(21) Appl. No.: 09/441,977

(22) Filed: Nov. 17, 1999

(51) Int. Cl.[7] .................................................. H03D 3/24

(52) U.S. Cl. ........................ 375/375; 327/163; 370/516

(58) Field of Search ................................ 375/327, 391, 375/373, 374, 375, 376; 327/156, 157, 158, 159, 163; 331/11, 15; 370/503, 516, 517, 518, 519

(56) References Cited

U.S. PATENT DOCUMENTS 4,961,188 A 10/1990 Lau ............................ 370/519
5,007,070 A 4/1991 Chao et al. ................. 375/371
5,142,555 A * 8/1992 Whiteside ................... 375/327
5,471,511 A 11/1995 De Langhe et al. ........ 375/376
5,525,935 A * 6/1996 Joo et al. ....................... 331/11
5,987,085 A * 11/1999 Anderson ................... 375/374

* cited by examiner

*Primary Examiner*—Stephen Chin
*Assistant Examiner*—Chieh M. Fan
(74) *Attorney, Agent, or Firm*—David P Gordon; David S Jacobson; Thomas A Gallagher

(57) ABSTRACT

A phase/frequency detector includes two D-Q flip-flops, an OR gate, and an exclusive NOR (XNOR) gate. The phase/frequency detector is used in conjunction with a clock dejitter PLL where the underflow and overflow flags from a FIFO are coupled to the inputs of the OR gate and the Q outputs of the flip-flops are coupled to the inputs of the XNOR gate. The Qb output of each flip-flop is coupled to the D input of the respective flip-flop. The recovered clock signal is coupled to the clock input of the first flip-flop and the output of the VCXO is coupled to the clock input of the second flip-flop. The SET input of the first flip-flop is coupled to the overflow flag and the RESET input of the first flip-flop is coupled to the underflow flag. The SET input of the second flip-flop is coupled to the output of the OR gate and the output of the XNOR gate is passed through the filter to the input of the VCXO. When the phase is locked, the output of the XNOR has a 50% duty cycle which causes the voltage across the filter to remain constant which maintains a steady VCXO output frequency. The FIFO will either underflow or overflow if the recovered clock and the VCXO run at different speeds. In this case, the flip-flops generate correction pulses that will drive the PLL filter voltage to the point where the VCXO is running at the correct frequency.

10 Claims, 4 Drawing Sheets

PHASE/FREQUENCY DETECTOR FOR DEJITTER APPLICATIONS

BACKGROUND OF THE INVENTION

1. Field of the Invention

The invention relates to telecommunications. More particularly, the invention relates to a circuit for removing “jitter” from a recovered clock signal in a telecommunications network.

2. State of the Art

The first commercial digital voice communications system was installed in 1962 in Chicago, Ill. The system was called “T1” and was based on the time division multiplexing (TDM) of twenty-four telephone calls on two twisted wire pairs. The digital bit rate of the T1 system was 1.544 Mbit/sec (±200 bps), which was, in the nineteen sixties, about the highest data rate that could be supported by a twisted wire pair for a distance of approximately one mile. The cables carrying the T1 signals were buried underground and were accessible via manholes, which were, at that time in Chicago, spaced approximately one mile (actually, 6,000 ft.) apart. Thus, analog amplifiers with digital repeaters were conveniently located at intervals of approximately one mile.

Thy T1 system is still widely used today and forms a basic building block for higher capacity communication systems such as T3 which transports twenty-eight T1 signals. The designation T1 was originally coined to describe a particular type of carrier equipment. Today T1 is often used to refer to a carrier system, a data rate, and various multiplexing and framing conventions. While it is more accurate to use the designation “DS1” when referring to the multiplexed digital signal formed at an 8 KHz rate and used to carry twenty-four voice channels by the T1 carrier, the designations DS1 and T1 are often used interchangeably. Today, T1 /DS1 systems still have a data rate of 1.544 Mbit/sec and support up to twenty-four voice and/or data DS0 channels. Similarly, the designations DS2 and T2 both refer to a system transporting up to four DS1 signals (96 DS0 channels) and the designations DS3 and T3 both refer to a system transporting up to seven DS2 signals (672 DS0 channels). The timing tolerance for modern T1 equipment has been narrowed to ±50 bps. The T1 and T2 standards are utilized in North America and Japan. Similar, but incompatible, standards called E1 and E2 are utilized in Europe. The T3 standard is utilized in North America and a similar, but incompatible, standard called E3 is utilized in Europe. In the 1980s, fiber optic technology called SONET (synchronous optical network) provided a measure of compatibility between T3 and E3 by allowing both to be mapped into an STS-1 signal.

The current standard for T1/DS1 systems incorporates many improvements and enhancements over the original T1 system. The basic T1 system is based on a frame of 193 bits, i.e. twenty-four 8-bit channels (the payload) and one framing bit (F). According to today’s standards, the 192 bit payload need not be “channelized” into 24 DS0 channels. In addition, superframe and extended superframe formats have been defined (as is known in the art).

In addition to modern framing conventions, the present T1 specification also includes provisions for different “line codes”, sometimes referred to as “transmission codes”. It will be appreciated that the T1 signal is a plesiochronous (tightly controlled asynchronous) signal and, unlike a synchronous (SONET) signal, is still subject to wander, jitter, and slips. Line codes are signalling conventions which are designed to facilitate frame synchronization and error detection.

Asynchronous Transfer Mode (ATM) is a packet oriented technology which permits continuous bit rate signals carrying one or more of voice, video, and data, to be conveyed across a network within packets. ATM is suitable for the transport of bursty traffic such as data, as well as accommodating constant or continuous bit rate signals. In delivering continuous bit rate traffic (e.g., T1, DS3 signals) in a broadband network, the clock controlling the destination node buffer must operate at a frequency precisely matched to that of the service signal input at the source node in order to avoid buffer overflow or underflow and resulting loss of data. However, the clock frequency at the destination node cannot easily be traced directly back to that of the source, because the ATM network inherently introduces cell jitter; i.e., random delay and aperiodic arrival of cells at a destination node, which corrupts the value of the cell arrival times and makes their use more difficult as a means for directly recovering the original service signal input frequency.

Clock recovery can be provided by a timestamp or an adaptive clock. The first method is called the synchronous residual timestamp (SRTS). The SRTS method assumes the presence of a common synchronous network clock from which both the sender and the receiver can reference. In the adaptive clock method, the receiver buffers incoming traffic and compares the level of the buffer with a local clock. The level of the buffer is used to control the frequency of the clock.

Prior Art FIG. 1 illustrates a typical arrangement of a Phase Lock Loop (PLL) circuit for clock dejitter. The circuit 10 includes a FIFO buffer 12, a voltage controlled oscillator (VCXO) 14, a filter 16, and a circuit 18 which is used to control the VCXO 14 via a signal applied to the filter 16. Received data is written into the FIFO using the (recovered clock) RCLK signal and reads data out using the dejittered clock signal produced by the VCXO. If the VCXO and the RCLK are not the same speed, the FIFO will either underflow or overflow. The circuit 18 attempts to adjust the VCXO in response to FIFO underflow/overflow. Exemplary circuits for controlling a VCXO via a filter in response to overflow and underflow flags are disclosed in U.S. Pat. Nos. 4,961,188, 5,007,070, and 5,471,511. In general, the circuits used to control the VCXO include numerous counters and multiplexers which compare overflow and underflow to thresholds and set the VCXO to various thresholds accordingly. The circuits are cumbersome, complex, and expensive.

SUMMARY OF THE INVENTION

It is therefore an object of the invention to provide a circuit for removing “jitter” from a recovered clock signal in a telecommunications network.

It is also an object of the invention to provide a circuit for controlling a VCXO so that it closely matches the recovered clock in a telecommunications network.

It is another object of the invention to provide a compact and simple circuit for controlling a VCXO.

In accord with these objects which will be discussed in detail below, the circuit of the present invention is intended to be used with a FIFO buffer having overflow and underflow flags, a filter, and a voltage controlled oscillator (VCXO). The circuit of the invention includes two D-Q flip-flops, an OR gate, and an XNOR (exclusive NOR) gate. The underflow and overflow flags from the FIFO are coupled to the inputs of the OR gate and the Q outputs of the flip-flops are coupled to the inputs of the XNOR gate. The Qb output of each flip-flop is coupled to the D input of the respective flip-flop. The recovered clock signal is coupled to the clock input of the first flip-flop and the output of the VCXO is coupled to the clock input of the second flip-flop. The SET input of the first flip-flop is coupled to the overflow flag and the RESET input of the first flip-flop is coupled to the underflow flag . The SET input of the second flip-flop is coupled to the output of the OR gate and the output of the XNOR gate is passed through the filter to the input of the VCXO.

The circuit operates both as a phase detector and a frequency detector. If the average frequency of the recovered clock is equal to the dejittered clock frequency (the output of the VCXO), then the circuit acts as a phase detector with the two flip-flops acting as divide-by-two circuits. When phase-locked (90° shifted), the output of the XNOR will have a 50% duty cycle. If the recovered clock is more than 90° ahead of the dejittered clock, then the XNOR output will be high more than 50% of the time which will cause the VCXO to run faster due to the increasing voltage at the filter output. When the recovered clock is less than 90° ahead of the dejittered clock, then the XNOR output will be low more than 50% of the time which will cause the VCXO to run slower over time.

When there exists a frequency difference between the recovered clock and the dejittered clock, the circuit acts as a frequency detector. The underflow flag is used to reset the first flip-flop and set the second flip-flop. The overflow flag is used to set both flip-flops. If the FIFO underflows, the output of the first flip-flop goes low and the output of the second flip-flop goes high which causes the output of the XNOR to go low until the recovered clock or the VCXO transitions. This will remove a small amount of charge from the filter capacitor by momentarily narrowing the pulse width of the XNOR output. As the FIFO continues to underflow, indicating that the VCXO is running too fast, the filter capacitor will gradually be discharged until the control voltage at the VCXO forces the VCXO to run at the correct frequency. If the FIFO overflows, indicating that the VCXO is running too slow, both flip-flops are set causing the output of both flip-flops to go high. This causes the output of the XNOR to go high until the recovered clock or the VCXO transitions. This will gradually increase the amount of charge on the filter capacitor by momentarily widening the pulse width of the XNOR output. Over time the filter capacitor will be charged causing the VCXO to run faster until the correct frequency is reached.

In summary, the circuit of the invention acts as a phase detector during phase acquisition/lock and as a frequency detector in the frequency acquisition mode. When the phase is locked, the output of the XNOR has a 50% duty cycle which causes the voltage across the filter to remain constant which maintains a steady VCXO output frequency. In the frequency acquisition mode, the FIFO will either underflow or overflow if the recovered clock and the VCXO run at different speeds. In this case, the flip-flops generate correction pulses that will drive the PLL filter output voltage to the point where the VCXO is running at the correct frequency.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
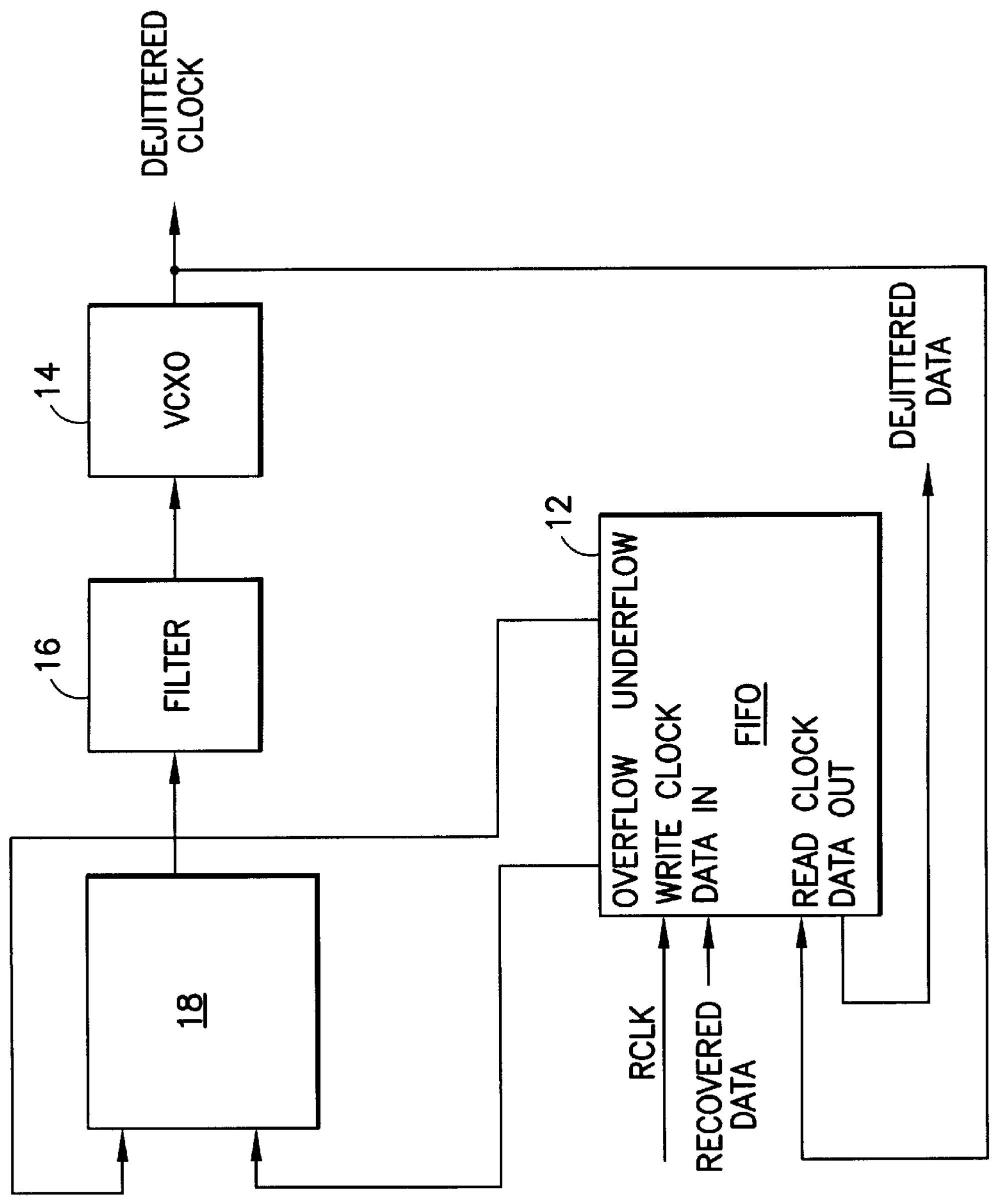
FIG. 1 is a schematic block diagram of a prior art circuit for dejittering a recovered clock signal.
Figure 2:
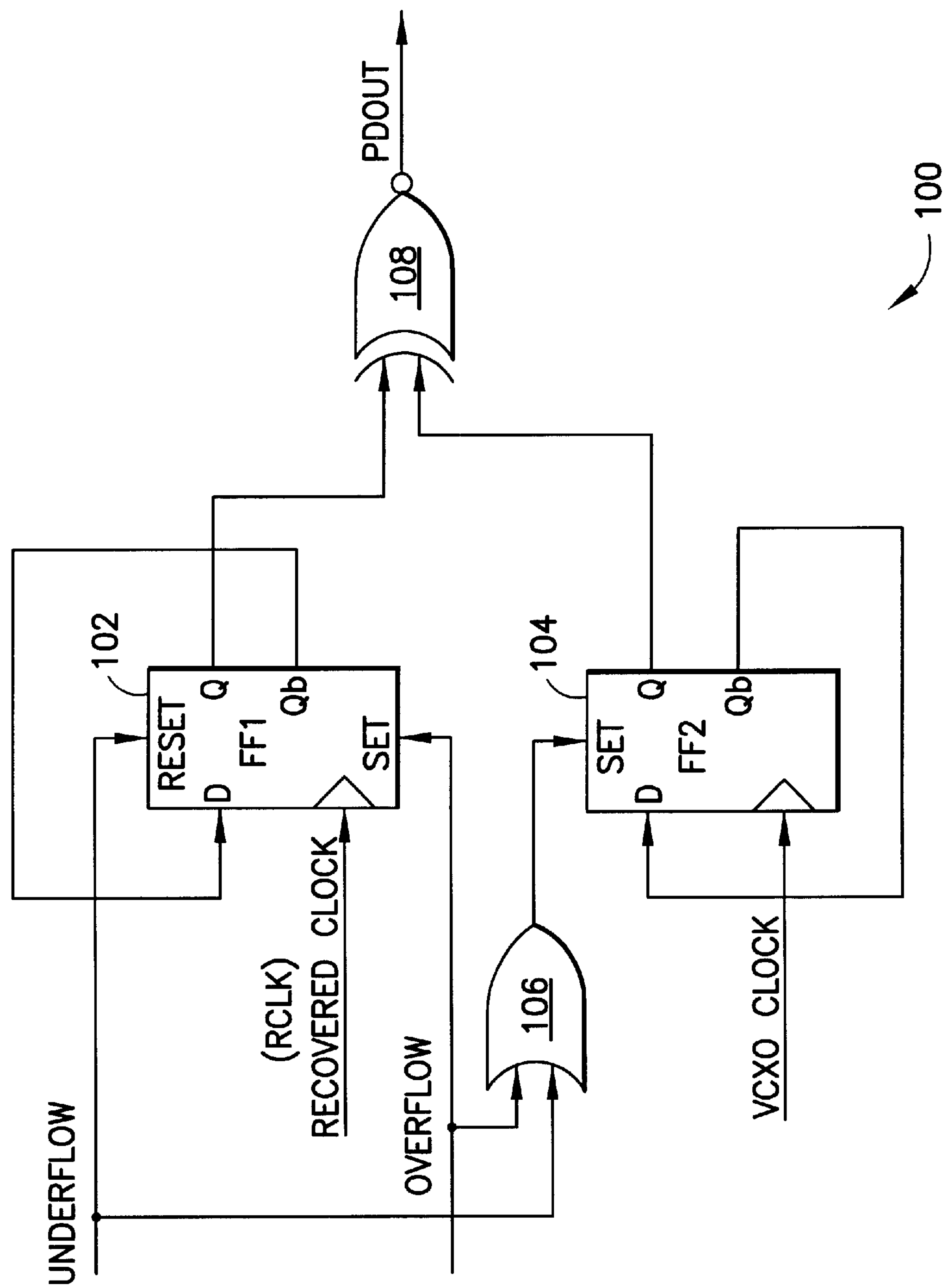
FIG. 2 is a schematic block diagram of a circuit according to the invention for use in dejittering a clock signal.
Figure 3:
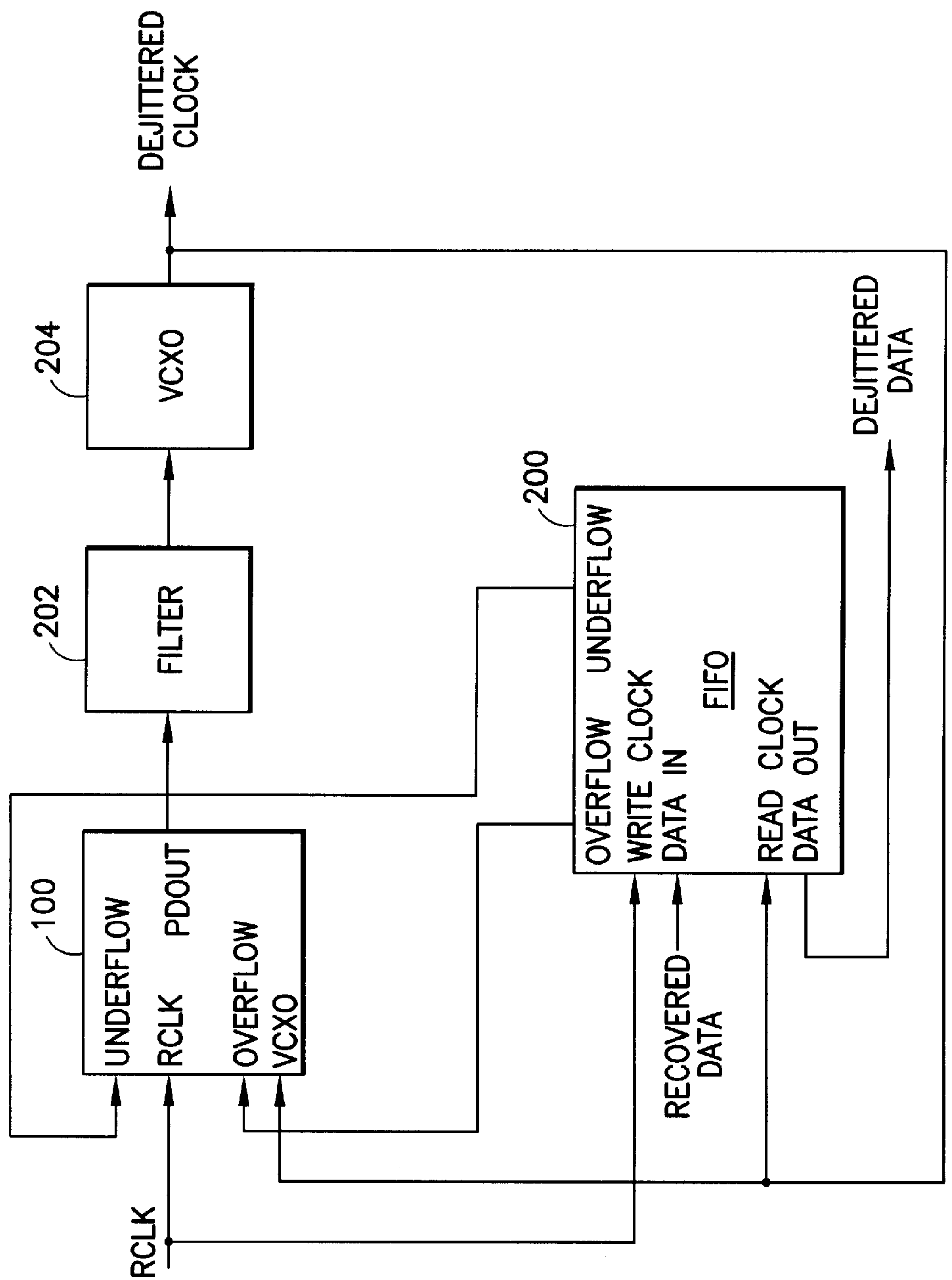
FIG. 3 is a schematic block diagram showing the circuit of the present invention used in conjunction with a PLL for dejittering a recovered clock signal in a telecommunications network node.

Turning now to FIGS. 2 and 3, the circuit 100 of the present invention is intended to be used with a FIFO buffer 200 having overflow and underflow flags, a filter 202, and a voltage controlled oscillator (VCXO) 204 for dejittering a recovered clock (RCLK) signal in a telecommunications network node. The circuit 100 of the invention generally includes two D-Q flip-flops 102, 104, an OR gate 106, and an XNOR (exclusive NOR) gate 108. The underflow and overflow flags from the FIFO 200 are coupled to the inputs of the OR gate 106 and the Q outputs of the flip-flops 102, 104 are coupled to the inputs of the XNOR gate 108. The Qb output of each flip-flop is coupled to the D input of the respective flip-flop. The recovered clock (RCLK) signal is coupled to the clock input of the first flip-flop 102 and the output of the VCXO 204 is coupled to the clock input of the second flip-flop 104. The SET input of the first flip-flop 102 is coupled to the overflow flag and the RESET input of the first flip-flop 102 is coupled to the underflow flag. The SET input of the second flip-flop is coupled to the output of the OR gate 106 and the output of the XNOR gate 108 is passed through the filter 202 to the input of the VCXO 204.

Figure 4:
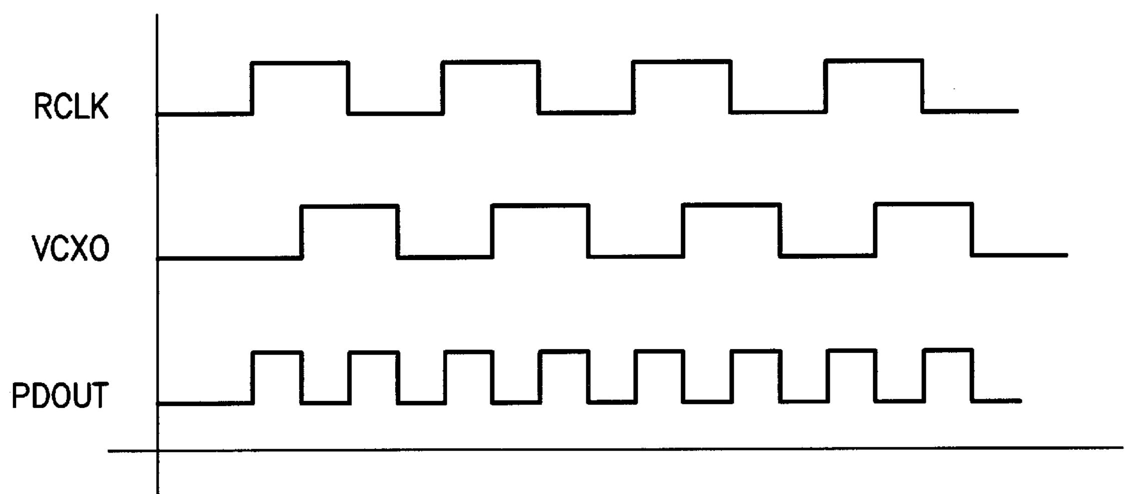
FIG. 4 is a simplified timing diagram illustrating the output of the circuit of the invention when the recovered clock is phase locked with (90° ahead of) the dejittered clock.
Figure 5:
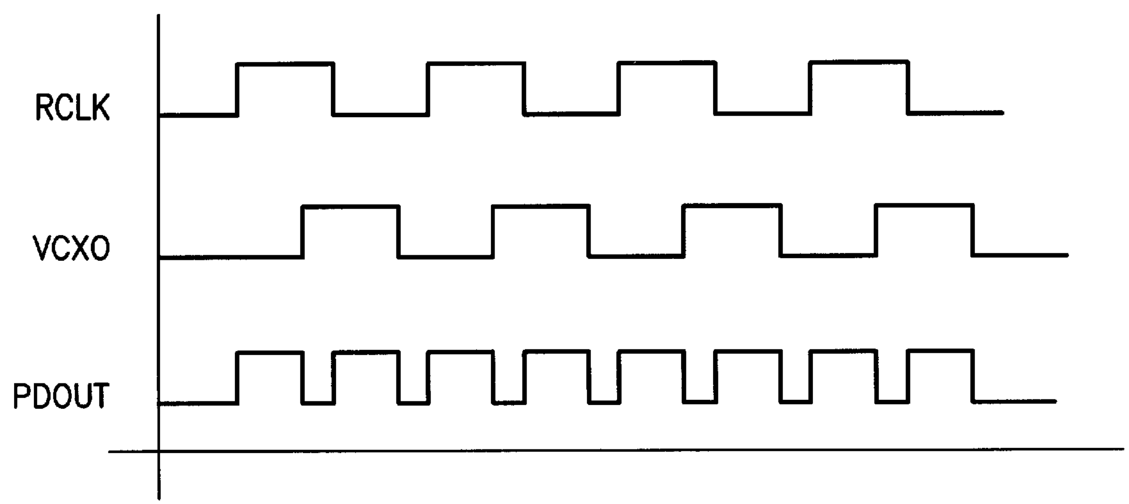
FIG. 5 is a diagram similar to FIG. 4 when the recovered clock is more than 90° ahead of the dejittered clock.
Figure 6:
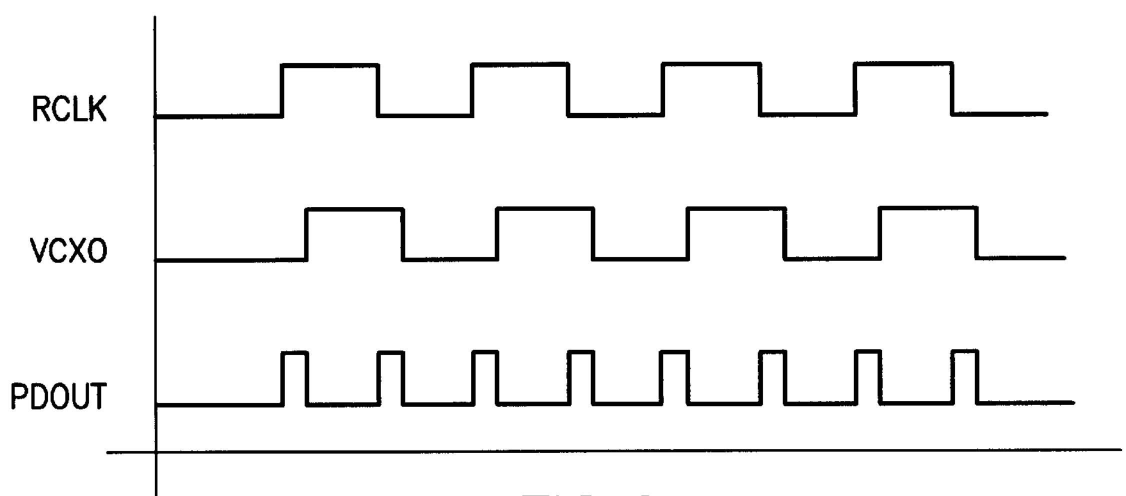
FIG. 6 is a diagram similar to FIG. 4 when the recovered clock is less than 90° ahead of the dejittered clock.

The circuit operates both as a phase detector and a frequency detector. If the average frequency of the recovered clock is equal to the dejittered clock (the output of the VCXO), then the circuit acts as a phase detector with the two flip-flops acting as divide-by-two circuits. When phase-locked at a 90° shift, the output of the XNOR will have a 50% duty cycle. This is illustrated in FIG. 4 where it can be seen the output (PDOUT) of the XNOR goes high when the leading edge of the RCLK causes the Q output of the first flip-flop to go high. The PDOUT signal will remain high until the phase delayed VCXO signal goes high causing the Q output of the second flip-flop to go high. So long as both RCLK and VCXO are high, the output of the XNOR will be high. As seen in FIG. 4, PDOUT goes low again when the trailing edge of the RCLK causes the Q output of the first flip-flop to go low. Those skilled in the art will appreciate that the pulse produced by PDOUT will have a 50% duty cycle so long as RCLK is 90° ahead of VCXO due to the overall action of the closed-loop feedback of the complete PLL. If the recovered clock is more than 90° ahead of the dejittered clock, then the XNOR output will be high more than 50% of the time which will cause the VCXO to run faster due to the increasing voltage on the filter. This is illustrated in FIG. 5 where it can be seen the output (PDOUT) of the XNOR goes high when the leading edge of the RCLK causes the Q output of the first flip-flop to go high and stays high until the phase delayed VCXO goes high. Since the phase delay of the VCXO is more than 90°, the pulse width of the PDOUT signal is broadened so that the signal has a duty cycle greater than 50%. When the recovered clock is less than 90° ahead of the dejittered clock, then the XNOR output will be low more than 50% of the time which will cause the VCXO to run slower over time. This is illustrated in FIG. 6 where it can be seen the output (PDOUT) of the XNOR goes high when the leading edge of the RCLK causes the Q output of the first flip-flop to go high and goes low as soon as VCXO goes high. Since the phase delay of the VCXO is less than 90°, the pulse width of the PDOUT signal is narrowed so that the signal has a duty cycle less than 50%.

When there exists a frequency difference between the recovered clock and the dejittered clock, the circuit acts as a frequency detector. The underflow flag is used to reset the first flip-flop and set the second flip-flop. The overflow flag is used to set both flip-flops. If the FIFO underflows, the output of the first flip-flop goes low and the output of the second flip-flop goes high which causes the output of the XNOR to go low until the recovered clock or the VCXO transitions. This will remove a small amount of charge from the filter capacitor. As the FIFO continues to underflow, the filter capacitor will be gradually discharged until the control voltage at the VCXO forces the VCXO to run at the correct frequency. If the FIFO overflows, both flip-flops are set causing the output of both flip-flops to go high. This causes the output of the XNOR to go high until the recovered clock or the VCXO transitions. Over time the filter capacitor is charged causing the VCXO to run faster until the correct frequency is reached.

When used together with the PLL components as described above, the circuit of the invention acts as a phase detector during phase acquisition/lock and as a frequency detector in the frequency acquisition mode. When the phase is locked, the output of the XNOR has a 50% duty cycle which causes the voltage across the filter to remain constant which maintains a steady VCXO output frequency. In the frequency acquisition mode, the FIFO will either underflow or overflow if the recovered clock and the VCXO run at different speeds. In this case, the flip-flops generate correction pulses that will drive the PLL filter voltage to the point where the VCXO is running at the correct frequency.

Those skilled in the art will appreciate that when the circuit is used to dejitter a recovered clock in a telecommunications node, the circuit will typically first act in the frequency acquisition mode and then act in the phase acquisition mode. It will also be appreciated that in addition to being simple and compact, the circuit of the invention prevents phase locking of different frequencies, e.g. phase locking of harmonic or subharmonic frequencies.

There have been described and illustrated herein a phase/frequency detector and a circuit incorporating the detector for dejittering a recovered clock signal. While a particular embodiment of the invention has been described, it is not intended that the invention be limited thereto, as it is intended that the invention be as broad in scope as the art will allow and that the specification be read likewise. Thus, while particular gates have been disclosed, it will be appreciated that other gates having the same logical operation could be utilized. Also, while particular flip-flops have been shown, it will be recognized that other types of flip-flops could be used with similar results obtained. It will therefore be appreciated by those skilled in the art that yet other modifications could be made to the provided invention without deviating from its spirit and scope as so claimed.

What is claimed is:

1. A phase/frequency detector circuit for use with an oscillator controller to cause the oscillator to generate a controlled signal having a phase and frequency which is closely related to a reference signal, said circuit comprising:

a) first means responsive to the reference signal for producing a first intermediate output corresponding to the reference signal;

b) second means responsive to the controlled signal for producing a second intermediate output corresponding to the controlled signal;

c) third means responsive to said first and second intermediate outputs for producing an oscillator control signal, said third means includes an exclusive NOR (XNOR) having a first input coupled to said first intermediate output and a second input coupled to said second intermediate output; and d) fourth means responsive to a change in frequency of the reference signal, said fourth means coupled to said first and second means, wherein said oscillator control signal has a duty cycle which corresponds to the phase difference between the reference signal and the controlled signal, and a change in the frequency of the reference signal causes the average duty cycle of the oscillator control signal to change.

2. A circuit according to claim 1, wherein:

said duty cycle is 50% when the reference signal and the controlled signal are phase locked.

3. A circuit according to claim 1, wherein:

said first means comprises a first D-Q flip-flop having a clock input, a Q output, and a Qb output and a D input which are coupled to each other, said clock input of said first D-Q flip-flop receiving the reference signal and said Q output of said first D-Q flip-flop producing said first intermediate signal, said second means comprises a second D-Q flip-flop having a clock input, a Q output, and a Qb output and a D input which are coupled to each other, where said clock input of said second D-Q flip-flop receives the controlled signal and said Q output of said second D-Q flip-flop produces said second intermediate signal, and said first input of said XNOR gate being coupled to said Q output of said first D-Q flip-flop and said second input of said XNOR gate being coupled to said Q output of said second D-Q flip-flop.

4. A circuit according to claim 3, wherein:

said fourth means comprises a SET input and a RESET input of said first D-Q flip-flop, a SET input of said second D-Q flip-flop, and an OR gate having two inputs and an output, said output of said OR gate being coupled to said SET input of said second D-Q flip-flop, said two inputs of said OR gate receiving respective indications of increase and decrease in frequency of the reference signal, said SET input of said first D-Q flip-flop receiving indications of increase in frequency of the reference signal and said RESET input of said first D-Q flip-flop receiving indications of decrease in frequency of the reference signal.

5. A phase/frequency detector for use with a FIFO buffer having overflow and underflow flags, a filter and a voltage controlled oscillator (VCXO) to dejitter a recovered clock signal (RCLK) in a telecommunications node, said circuit comprising:

a) first means responsive to the RCLK signal for producing a first intermediate output corresponding to the RCLK signal;

b) second means responsive to the VCXO signal for producing a second intermediate output corresponding to the VCXO signal;

c) third means responsive to said first and second intermediate outputs for producing an oscillator control signal, said third means includes an exclusive NOR (XNOR) having a first input coupled to said first intermediate output and a second input coupled to said second intermediate output; and d) fourth means responsive to the overflow and underflow flags, said fourth means coupled to said first and second means, wherein said oscillator control signal has a duty cycle which corresponds to the phase difference between the RCLK signal and the VCXO signal, said oscillator control signal being coupled to the filter and the filter being coupled to the VCXO to control the VCXO signal, and an overflow or underflow flag causes the average duty cycle of the oscillator control signal to change.

6. A circuit according to claim 5, wherein:

said duty cycle is 50% when the RCLK signal and the VCXO signal are phase locked.

7. A circuit according to claim 6, wherein:

said first means comprises a first D-Q flip-flop having a clock input, a Q output, and a Qb output and a D input which are coupled to each other, where said clock input of said first D-Q flip-flop receives the RCLK signal and said Q output of said first D-Q flip-flop produces said first intermediate signal, said second means comprises a second D-Q flip-flop having a clock input, a Q output, and a Qb output and a D input which are coupled to each other, where said clock input of said second D-Q flip-flop receives the VCXO signal and said Q output of said second D-Q flip-flop produces said second intermediate signal, and said first input of said XNOR being coupled to said Q output of said first D-Q flip-flop and said second input of said XNOR being coupled to said Q output of said second D-Q flip-flop.

8. A circuit according to claim 7, wherein:

said fourth means includes a SET input and a RESET input of said first D-Q flip-flop, a SET input of said second D-Q flip-flop, and an OR gate having two inputs and an output, said output of said OR gate being coupled to said SET input of said second D-Q flip-flop, said two inputs of said OR gate receiving respective overflow and underflow flags, said SET input of said first D-Q flip-flop receiving the overflow flag and said RESET input of said first D-Q flip-flop receiving the underflow flag.

9. A phase/frequency detector for use with a FIFO buffer having overflow and underflow flags, a filter coupled to a voltage controlled oscillator (VCXO) to dejitter a recovered clock signal (RCLK) in a telecommunications node, said circuit comprising:

a) a first flip-flop having a clock input, a D input, a RESET input, a SET input, a Q output, and a Qb output, said clock input of said first flip-flop being coupled to the RCLK signal, said RESET input of said first flip-flop being coupled to the underflow flag, said SET input of said first flip-flop being coupled to the overflow flag, and said Qb output of said first flip-flop being coupled to said D input of said first flip-flop;

b) a logical OR means having a first input coupled to the underflow flag, a second input coupled to the overflow flag, and an output;

c) a second flip-flop having a clock input, a D input, a SET input, a Q output, and a Qb output, said clock input of said second flip-flop being coupled to the VCXO signal, said SET input of said second flip-flop being coupled to said output of said logical OR means, and said Qb output of said second flip-flop being coupled to said D input of said second flip-flop; and d) a logical XNOR means having a first input coupled to said Q output of said first flip-flop, a second input coupled to said Q output of said second flip-flop, and an output coupled to the filter for controlling the VCXO.

10. A circuit for dejittering a recovered clock signal (RCLK) in a telecommunications node, said circuit comprising:

a) a FIFO buffer for buffering data received at the node, said FIFO buffer having a data input, a data output, a write clock input, a read clock input, an overflow flag, and an underflow flag, said write clock input being coupled to the RCLK signal;

b) a voltage controlled oscillator (VCXO) having a control input and an output coupled to said read clock input of said FIFO buffer;

c) a filter having an input and an output coupled to said control input of said VCXO; and d) a control circuit including i) a first flip-flop having a clock input, a D input, a RESET input, a SET input, a Q output, and a Qb output, said clock input of said first flip-flop being coupled to the RCLK signal, said RESET input of said first flip-flop being coupled to said underflow flag, said SET input of said first flip-flop being coupled to said overflow flag, and said Qb output of said first flip-flop being coupled to said D input of said first flip-flop, ii) a logical OR means having a first input coupled to said underflow flag, a second input coupled to said overflow flag, and an output, iii) a second flip-flop having a clock input, a D input, a SET input, a Q output, and a Qb output, said clock input of said second flip-flop being coupled to said output of said VCXO, said SET input of said second flip-flop being coupled to said output of said logical OR means, and said Qb output of said second flip-flop being coupled to said D input of said second flip-flop, and iv) a logical XNOR means having a first input coupled to said Q output of said first flip-flop, a second input coupled to said Q output of said second flip-flop, and an output coupled to said input of said filter for controlling the VCXO.

* * * * *